US011230471B2

(12) United States Patent
Cok

(10) Patent No.: US 11,230,471 B2
(45) Date of Patent: Jan. 25, 2022

(54) MICRO-TRANSFER-PRINTED COMPOUND SENSOR DEVICE

(71) Applicant: X-Celeprint Limited, Dublin (IE)

(72) Inventor: Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 96 days.

(21) Appl. No.: 15/412,881

(22) Filed: Jan. 23, 2017

(65) Prior Publication Data
US 2017/0225945 A1 Aug. 10, 2017

Related U.S. Application Data

(60) Provisional application No. 62/293,612, filed on Dec. 10, 2016, provisional application No. 62/291,830, filed on Feb. 5, 2016.

(51) Int. Cl.
*H01L 27/14* (2006.01)
*B81C 3/00* (2006.01)
*B81C 1/00* (2006.01)

(52) U.S. Cl.
CPC .......... *B81C 3/001* (2013.01); *B81C 1/00373* (2013.01); *B81B 2207/012* (2013.01);
(Continued)

(58) Field of Classification Search
CPC ............ B81B 2207/012; B81B 7/0077; B81C 2203/032; B81C 2203/0792; B81C 3/001; H01L 21/67144; H01L 21/67766; H01L 21/7624; H01L 2224/18; H01L 2225/06524; H01L 2225/06541; H01L 2225/06593; H01L 23/525; H01L 25/0657;
(Continued)

(56) References Cited

U.S. PATENT DOCUMENTS 6,142,358 A 11/2000 Cohn et al.
7,195,733 B2 3/2007 Rogers et al.
(Continued)

FOREIGN PATENT DOCUMENTS

JP 2003243646 A 8/2003
JP 2011066130 A 3/2011
(Continued)

OTHER PUBLICATIONS

Bower, C. A. et al., Transfer Printing: An Approach for Massively Parallel Assembly of Microscale Devices, IEE, Electronic Components and Technology Conference, (2008).
(Continued)

*Primary Examiner* — Meiya Li
(74) *Attorney, Agent, or Firm* — Choate, Hall & Stewart LLP; William R. Haulbrook; Michael D. Schmitt

(57) ABSTRACT

A compound sensor device includes a semiconductor substrate having an active electronic circuit formed in or on the semiconductor substrate. A sensor including a sensor substrate including a sensor circuit having an environmental sensor or actuator formed in or on the sensor substrate is micro-transfer printed onto the semiconductor substrate. One or more electrical conductors electrically connect the active electronic circuit to the sensor circuit. The semiconductor substrate includes a first material and the sensor substrate includes a second material different from the first material.

22 Claims, 10 Drawing Sheets

(52) U.S. Cl.
CPC ............ *B81C 2201/0194* (2013.01); *B81C 2203/051* (2013.01); *B81C 2203/0792* (2013.01)

(58) Field of Classification Search
CPC ............ H01L 25/50; H01L 21/67778; H01L 21/67781; H01L 21/68
See application file for complete search history.

(56) References Cited

U.S. PATENT DOCUMENTS

| | | |
|---|---|---|
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,440,546 B2 | 5/2013 | Nuzzo et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 2003/0141570 A1 | 7/2003 | Chen et al. |
| 2004/0113513 A1* | 6/2004 | Borwick, III ......... H02N 1/008 310/309 |
| 2010/0306993 A1 | 12/2010 | Mayyas et al. |
| 2013/0316487 A1 | 11/2013 | de Graff et al. |
| 2014/0159043 A1 | 6/2014 | Sakariya et al. |
| 2015/0028362 A1 | 1/2015 | Chan et al. |
| 2016/0093600 A1 | 3/2016 | Bower et al. |
| 2016/0118281 A1* | 4/2016 | Fiorenza ............ H01L 21/7624 101/492 |
| 2016/0347609 A1* | 12/2016 | Yu ..................... B81C 1/00238 |
| 2017/0048976 A1 | 2/2017 | Prevatte et al. |
| 2017/0069609 A1* | 3/2017 | Zhang ................. H01L 25/167 |
| 2017/0243988 A1 | 8/2017 | Bower et al. |
| 2017/0244386 A1 | 8/2017 | Bower et al. |
| 2017/0338374 A1 | 11/2017 | Zou et al. |

FOREIGN PATENT DOCUMENTS

| | | |
|---|---|---|
| JP | 2011238881 A | 11/2011 |
| WO | WO-2016/071370 A1 | 5/2016 |

OTHER PUBLICATIONS

Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100, (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AllnGaN micron-size light-emitting diodes, Crown, pp. 217-218, (2012).

* cited by examiner

MICRO-TRANSFER-PRINTED COMPOUND SENSOR DEVICE

PRIORITY APPLICATIONS

This application claims priority to U.S. Provisional Patent Application No. 62/291,830, filed Feb. 5, 2016, entitled Micro-Transfer-Printed Compound Sensor Device, and to U.S. Provisional Patent Application No. 62/293,612, filed Feb. 10, 2016, entitled Micro-Transfer-Printed Compound Sensor Device, the contents of all of which are hereby incorporated by reference in their entirety.

CROSS REFERENCE TO RELATED APPLICATION

This application is related to U.S. patent application Ser. No. 15/047,250 filed Feb. 18, 2016, entitled Micro-Transfer-Printed Acoustic Wave Filter Device, and to U.S. patent application Ser. No. 15/048,134, filed Feb. 19, 2016, entitled Compound Micro-Transfer-Printed Optical Filter Device, and to G.B. Patent Application Ser. No. 1419515.0 filed Nov. 3, 2014, entitled Magnetic Field Sensor and Method of Making Same, the contents of all of which are hereby incorporated by reference in their entirety.

FIELD OF THE INVENTION

The present invention relates to integrated heterogeneous structures, and more particularly to a sensor micro-transfer printed onto a semiconductor substrate.

BACKGROUND OF THE INVENTION

Electronic sensors are widely used in electronic control devices. In particular, machines with moving parts frequently rely on electronic sensors to detect the position of mechanical parts, electrical current, electrical fields, magnetic fields, or other attributes of the environment in which the machine operates. A wide variety of sensors are known, such as magnetic sensors, electrical field sensors, electromagnetic radiation sensors, temperature sensors, humidity sensors, and optical sensors. Information from the sensors is often processed, for example using digital processing circuits, so that the electronic sensors and the information derived from the sensors can be implemented within electronic systems, such as electro-mechanical systems. For example, automobiles and aircraft incorporate a large number of sensors whose input is electronically processed and used for control.

Signal processing, particularly digital signal processing, is most often performed in electronic integrated circuits comprising silicon transistors. Although some sensors are readily constructed in silicon, enabling an efficient integration of sensors and processing circuitry, some sensors are more readily and effectively constructed in other materials, for example compound semiconductor materials such as gallium arsenide. Systems of the prior art incorporating sensors using different materials than are used for processing signals from the sensors are integrated by electrically connecting the sensors to a processor on a substrate, such as a printed circuit board.

In conventional sensor packages, such as image sensor packages, the sensor chip is mounted in a chip carrier and electrically connected to the chip carrier via bonding wires. The sensor package is then integrated with and mounted on an external device such as a printed circuit board. In an alternative approach, described in U.S. Pat. No. 7,365,364, a chip-scale package uses a photolithographically formed electrical connection to a substrate. U.S. Pat. No. 7,368,695 describes a multi-substrate structure and U.S. Pat. No. 7,439,750 describes a humidity sensor mounted on a printed circuit board. These arrangements, however, do not more efficiently integrate processing and sensing devices.

In an alternative structure, JP2003243646 describes a method of making a composite semiconductor element. A compound semiconductor thin film is formed on a substrate and an adhesive coated on an integrated circuit. The thin film is adhered to the adhesive and the substrate removed, leaving the compound semiconductor thin film adhered to the integrated circuit. The thin film is processed and then the adhesive is patterned to expose connection pads on the integrated circuit. A connection electrode is provided to wire the connection pads. However, this approach requires that the thin film is processed with the integrated circuit, which is less efficient and can expose the integrated circuit to process conditions for which it is not well suited.

In some cases, sensor size and integration are important system attributes, for example when physical space is limited. There is a need, therefore, for alternative structures and methods that provide improved integration and reduced size for sensor systems.

SUMMARY OF THE INVENTION

Embodiments of the present invention provide a compound sensor device comprising a semiconductor substrate having an active electronic circuit formed in or on the semiconductor substrate. The active electronic circuit includes one or more circuit connection pads connected to the active electronic circuit for providing signals to the active electronic circuit or receiving signals from the active electronic circuit. A sensor controlled at least in part by the active electronic circuit includes a sensor substrate separate, distinct, and independent from the semiconductor substrate and a sensor circuit formed in or on the sensor substrate. The sensor circuit includes an environmental sensor or actuator and one or more sensor connection pads connected to the sensor circuit for providing signals to the sensor circuit or receiving signals from the sensor circuit. One or more electrical conductors electrically connect one or more of the circuit connection pads to one or more of the sensor connection pads. The semiconductor substrate is produced in a first technology comprising a first material and the sensor substrate is produced in a second technology different from the first technology and comprising a second material different from the first material. Sensors of the present invention can be, for example, magnetic sensors, electrical field sensors, electromagnetic radiation sensors, temperature sensors, humidity sensors, and optical sensors.

By micro-transfer printing the sensor directly or indirectly onto the semiconductor substrate, the compound sensor device of the present invention is more highly integrated and therefore smaller and less expensive than alternative designs and can have better performance. The sensor substrate or the semiconductor substrate can be bare dies. The sensor substrate can be directly or indirectly micro-transfer printed on or adhered to the semiconductor substrate. Thus, the compound sensor device of the present invention can be packaged in a single package rather than two separate packaged devices interconnected on a third substrate such as a printed circuit board. Furthermore, by directly or indirectly micro-transfer printing the sensor substrate onto the semiconductor substrate, the length and extent of the electrical connections between the semiconductor substrate and the sensor substrate are reduced, reducing noise, increasing operating frequencies and generally increasing the device performance, especially for applications requiring relatively high operating frequencies. The sensor substrate can be micro-transfer printed directly or indirectly on or over the active electronic circuit, further reducing the device size and improving the device integration. In a further embodiment of the present invention, a plurality of sensor substrates is directly or indirectly micro-transfer printed on or adhered to a single semiconductor substrate, enabling multiple sensor operations within a single packaged device, such as a surface-mount device. In an embodiment of the present invention, the semiconductor substrate and active electronic circuit are constructed and processed separately from the sensor substrate and electrodes.

In a further embodiment of the present invention, a sensor wafer includes a wafer of substrate material having a patterned sacrificial layer forming sacrificial portions on, over, or in the substrate material, a surface of the substrate material, the wafer, or a surface of the wafer. The sacrificial portions separate anchors between the sacrificial portions. A sensor is formed entirely over each sacrificial portion, the sensor comprising a sensor substrate on or in which a sensor circuit is formed, together sensor connection pads and electrical conductors. The portion of each sensor in contact with the sacrificial portion is chemically and selectively etch-resistant so that the contact portion has a chemical selectivity different from the patterned sacrificial layer.

In another embodiment, a sensor wafer includes a source wafer of semiconductor material. A patterned sacrificial layer forms sacrificial portions on, over, or in the semiconductor material, a surface of the semiconductor material, the source wafer, or a surface of the source wafer, the sacrificial portions defining separate anchors between the sacrificial portions. An active electronic circuit is formed entirely over the sacrificial portions. A sensor is micro-transfer printed entirely over each active electronic circuit and sacrificial portion. The portion of the active electronic circuit in contact with the sacrificial portion is chemically and selectively etch-resistant so that the contact portion has a chemical selectivity different from the patterned sacrificial layer.

In a method of the present invention, a semiconductor substrate is provided with an active electronic circuit formed in or on the semiconductor substrate and a sensor substrate separate, distinct, and independent from the semiconductor substrate is provided. The sensor substrate is made of a different material and can be made using a different technology than is used to make the semiconductor substrate. A sensor circuit is formed in or on the sensor substrate to form a sensor. One or more sensor substrates are mounted on the semiconductor substrate by micro-transfer printing and one or more of the circuit connection pads are electrically connected to the one or more sensor circuits through the sensor connection pads to construct a compound sensor device.

Embodiments of the present invention therefore enable devices comprising a variety of different heterogeneous materials that can each be processed or assembled separately using different, possibly incompatible, processes, materials, and technologies. By using semiconductor materials in at least the semiconductor substrate, the devices can incorporate logic circuits, such as state machines or computers such as digital stored program machines. Thus, embodiments of the present invention provide intelligent, highly integrated heterogeneous devices useful in a wide variety of applications and modalities.

In one aspect, the disclosed technology includes a compound sensor device, including: a semiconductor substrate; an active electronic circuit formed in or on the semiconductor substrate; one or more circuit connection pads connected to the active electronic circuit for providing signals to the active electronic circuit or receiving signals from the active electronic circuit; a sensor including: a sensor substrate separate, distinct, and independent from the semiconductor substrate, the sensor micro-transfer printed onto the semiconductor substrate, a sensor circuit formed in or on the sensor substrate, the sensor circuit comprising an environmental sensor or actuator, and one or more sensor connection pads connected to the sensor circuit for providing signals to the sensor circuit or receiving signals from the sensor circuit; and one or more electrical conductors electrically connecting one or more of the circuit connection pads to one or more of the sensor connection pads, wherein the semiconductor substrate comprises a first material and the sensor substrate comprises a second material different from the first material.

In certain embodiments, the sensor substrate is a semiconductor substrate.

In certain embodiments, the first material is a silicon semiconductor and the second material is a compound semiconductor.

In certain embodiments, the first material is a crystalline semiconductor or the second material is a crystalline semiconductor.

In certain embodiments, the semiconductor substrate has a process side, the active electronic circuit is formed on or in the process side, and the sensor substrate is micro-transfer printed onto the process side.

In certain embodiments, the sensor substrate has a substrate area that is smaller than the area of the semiconductor substrate or that is less than or equal to 80%, 70%, 60%, 50%, 40%, 30%, 20%, or 10% of the area of the semiconductor substrate.

In certain embodiments, the sensor extends from the semiconductor substrate in a direction orthogonal to the semiconductor substrate surface.

In certain embodiments, the sensor extends from the semiconductor substrate in a direction parallel to the semiconductor substrate surface.

In certain embodiments, the sensor has a first portion smaller than a second portion and the first portion extends from the semiconductor substrate.

In certain embodiments, the sensor has a plurality of first portions smaller than one or more second portions and the first portions extend from the semiconductor substrate.

In certain embodiments, the sensor is adhered to the semiconductor substrate with an adhesive layer.

In certain embodiments, the adhesive layer has an area over the semiconductor substrate that is different from the area of the semiconductor substrate.

In certain embodiments, the sensor substrate is thinner than the semiconductor substrate.

In certain embodiments, the semiconductor substrate or the sensor substrate has at least one of: a thickness from 50 µm to 20 µm, 20 µm to 10 µm, 10 µm to 5 µm, 5 µm to 1 µm, or 1 µm 0.1 µm, a width from 2 to 5 µm, 5 to 10 µm, 10 to 20 µm, or 20 to 50 µm, a length from 2 to 5 µm, 5 to 10 µm, 10 to 20 µm, or 20 to 50 µm.

In certain embodiments, the sensor comprises at least a portion of a tether.

In certain embodiments, the compound sensor device is a surface-mount device.

In certain embodiments, the compound sensor device has a length or breadth dimension from 1 mm to 800 µm, 800 µm to 800 µm, 800 µm to 400 µm, 400 µm to 200 µm, 200 µm to 100 µm, 100 µm to 50 µm, 50 µm to 20 µm, 20 µm to 10 µm, or 10 µm to 1 µm.

In certain embodiments, the sensor is at least one of: micro-transfer printed directly on the semiconductor substrate, adhered directly to the semiconductor substrate, micro-transfer printed directly on the active electronic circuit, and located such that the active electronic circuit is at least partially between the sensor and the semiconductor substrate.

In certain embodiments, the sensor circuit comprises an environmental sensor and an actuator, a plurality of environmental sensors, a plurality of actuators, or a plurality of environmental sensors and a plurality of actuators.

In certain embodiments, the compound sensor device includes a plurality of sensors and one or more electrical conductors electrically connecting one or more of the circuit connection pads to one or more of the sensor connection pads of each sensor, wherein the semiconductor substrate comprises a first material and each sensor substrate comprises a second material different from the first material.

In certain embodiments, a sensor substrate comprises a different material than another sensor substrate.

In certain embodiments, the sensor, the sensor substrate, or a layer of the sensor is chemically etch-resistant.

In certain embodiments, the electrical conductors are electrically conductive protrusions or spikes extending from the sensor, a portion or layer of the sensor, or the sensor substrate.

In another aspect, the disclosed technology includes a method of making a compound sensor device, including: providing a semiconductor substrate with an active electronic circuit formed in or on the semiconductor substrate and one or more circuit connection pads for providing signals to the active electronic circuit or receiving signals from the active electronic circuit; providing a sensor, the sensor including: a sensor substrate separate, distinct, and independent from the semiconductor substrate, a sensor circuit formed in or on the sensor substrate, the sensor circuit comprising an environmental sensor or actuator, and one or more sensor connection pads connected to the sensor circuit for providing signals to the sensor circuit or receiving signals from the sensor circuit; micro-transfer printing the sensor substrate onto the semiconductor substrate; and electrically connecting one or more of the circuit connection pads to one or more of the sensor connection pads, wherein the semiconductor substrate comprises a first material and the sensor substrate comprises a second material different from the first material.

In certain embodiments, the method includes disposing an adhesive layer between the sensor and the semiconductor substrate before the sensor is micro-transfer printed on the semiconductor substrate.

In certain embodiments, the adhesive is a curable adhesive and the method comprises curing the adhesive layer to adhere the sensor substrate to the semiconductor substrate after the sensor substrate is disposed on the semiconductor substrate.

In certain embodiments, the adhesive is a curable adhesive and the method comprises curing the adhesive layer to adhere the sensor to the semiconductor substrate after the sensor is micro-transfer printed onto the semiconductor substrate.

In certain embodiments, the electrical conductors are electrically conductive protrusions or spikes extending from the sensor or the sensor substrate, and comprising pressing the electrically conductive protrusions or spikes against, into, or through the circuit connection pads to form an electrical connection between the sensor and the active electronic circuit.

In certain embodiments, the method includes providing a plurality of sensors having a corresponding plurality of sensor substrates; micro-transfer printing the sensors and sensor substrates onto the semiconductor substrate; and electrically connecting each of the sensor circuits of each of the sensors to one or more of the circuit connection pads with electrical conductors.

In certain embodiments, the sensor substrate has a sensor substrate area that is smaller than the area of the semiconductor substrate or the active electronic circuit or that is less than or equal to 80%, 70%, 60%, 50%, 40%, 30%, 20%, or 10% of the area of the semiconductor substrate.

In certain embodiments, the active electronic circuit is located at least partially between the sensor and the semiconductor substrate.

In certain embodiments, the semiconductor substrate has a process side, the active electronic circuit is formed on or in the process side, and the sensor is micro-transfer printed onto the process side.

In certain embodiments, the sensor, a layer of the sensor, or the sensor substrate is chemically etch-resistant.

In another aspect, the disclosed technology includes a sensor wafer, including: a source wafer of substrate material; a patterned sacrificial layer forming sacrificial portions on, over, or in the substrate material, a surface of the substrate material, the source wafer, or a surface of the source wafer, wherein the sacrificial portions define separate anchors between the sacrificial portions; a sensor formed entirely over each sacrificial portion, the sensor including: a sensor substrate, a sensor circuit formed in or on the sensor substrate, the sensor circuit comprising an environmental sensor or actuator, and one or more sensor connection pads connected to the sensor circuit for providing signals to the sensor circuit or receiving signals from the sensor circuit, wherein the portion of the sensor in contact with the sacrificial portion is chemically and selectively etch-resistant so that the contact portion has a chemical selectivity different from the patterned sacrificial layer.

In certain embodiments, the contact portion is a portion of the sensor substrate.

In certain embodiments, the patterned sacrificial layer is a patterned layer of etchable material or a gap between the contact and the substrate material.

In another aspect, the disclosed technology includes a sensor wafer, including: a source wafer of semiconductor material; a patterned sacrificial layer forming sacrificial portions on, over, or in the semiconductor material, a surface of the semiconductor material, the source wafer, or a surface of the source wafer, the sacrificial portions defining separate anchors between the sacrificial portions; an active electronic circuit formed entirely over the sacrificial portions; and a sensor micro-transfer printed entirely over each active electronic circuit and sacrificial portion, the sensor including: a sensor substrate comprising a material different from the semiconductor material of the source wafer, a sensor circuit formed in or on the sensor substrate, the sensor circuit comprising an environmental sensor or actuator, and one or more sensor connection pads connected to the sensor circuit for providing signals to the sensor circuit or receiving signals from the sensor circuit, wherein the portion of the active electronic circuit in contact with the sacrificial portion is chemically and selectively etch-resistant so that the contact portion has a chemical selectivity different from the patterned sacrificial layer.

In another aspect, the disclosed technology includes a method of making a sensor wafer, including: providing a source wafer; forming a patterned sacrificial layer on or over the source wafer; forming a sensor substrate on or over the patterned sacrificial layer; and forming a sensor circuit formed in or on the sensor substrate, the sensor circuit comprising an environmental sensor or actuator and one or more sensor connection pads connected to the sensor circuit for providing signals to the sensor circuit or receiving signals from the sensor circuit.

In certain embodiments, the method includes etching the patterned sacrificial layer to form a micro-transfer printable sensor.

In certain embodiments, the method includes providing a semiconductor substrate with an active electronic circuit formed entirely over a patterned sacrificial layer in or on the semiconductor substrate and micro-transfer printing the sensor onto or over the active electronic circuit to form a compound sensor device.

In certain embodiments, the method includes etching the patterned sacrificial layer to form a micro-transfer printable compound sensor device.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
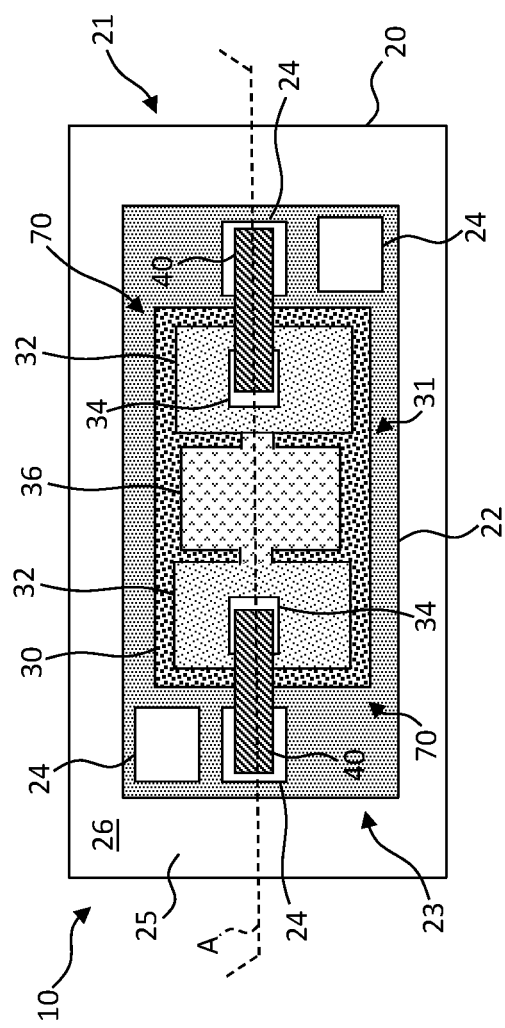
FIG. 1A is a schematic plan view of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 1B:
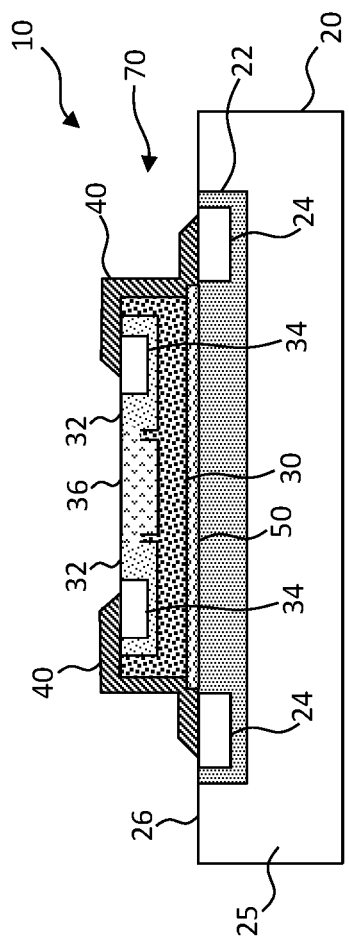
FIG. 1B is a cross section of an embodiment of the present invention taken across the cross section line A of FIG. 1A.
Figure 10:
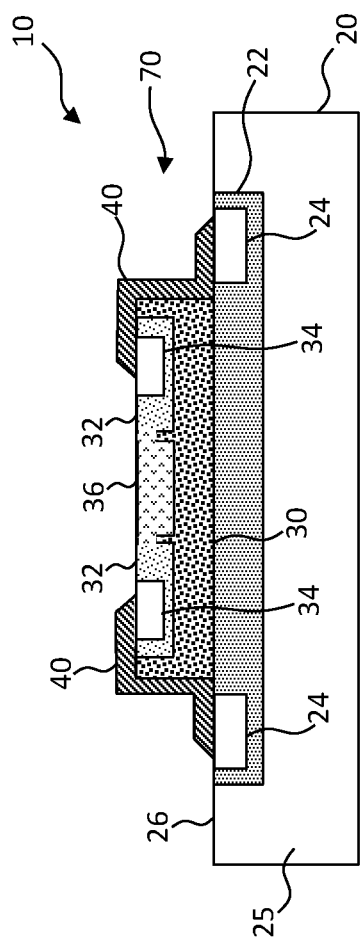
FIG. 10 is a cross section of a compound sensor device without an adhesive layer.

Referring to the schematic plan view of FIG. 1A and the schematic cross section of FIG. 1B taken across cross section line A of FIG. 1A, in an embodiment of the present invention, a compound sensor device 10 includes a semiconductor substrate 20. An active electronic circuit 22 is formed in or on the semiconductor substrate 20, for example, using photolithographic methods found in the integrated circuit industry. The active electronic circuit 22 can be, for example, a circuit for controlling a sensor 70, sending or receiving signals to or from the sensor 70, or processing signals received from the sensor 70. The active electronic circuit 22 can also send and receive signals to and from an external device (not shown). The active electronic circuit 22 includes two or more circuit connection pads 24 connected to the active electronic circuit 22 for providing signals to the active electronic circuit 22 or receiving signals from the active electronic circuit 22. The sensor 70 is responsive to and controlled at least in part by the active electronic circuit 22 and includes a sensor substrate 30 separate, distinct, and independent from the semiconductor substrate 20. The sensor 70 is micro-transfer printed onto the semiconductor substrate 20 (e.g., FIG. 10) or onto an adhesive layer 50 between the semiconductor substrate 20 and the sensor 70 and can be in direct contact with either.

A sensor circuit 36 is formed in or on the sensor substrate 30. The sensor circuit 36 includes an environmental sensor or actuator and one or more sensor connection pads 34 connected to the sensor circuit 36 for providing signals to the sensor circuit 36 or receiving signals from the sensor circuit 36. The sensor 70, sensor circuit 36, and sensor substrate 30 are referred to as sensor elements, but the elements can also be an actuator, an actuator circuit, and an actuator substrate and are referred to only as a sensor element for simplicity and clarity of expression and exposition herein. An environmental sensor is a sensing device that reacts to the environment to produce a signal, for example in response to a control signal such as an electrical control signal. An environmental actuator is a device that controls or modifies an element in the environment in response to a signal, for example in response to a control signal such as an electrical control signal. In an embodiment, the sensor 70 can include multiple sensors, multiple actuators, or both one or more sensors and actuators. Embodiments of the present invention include environmental actuators as well as environmental sensors.

The compound sensor device 10 is a compound device because it incorporates two different substrates (e.g., the semiconductor substrate 20 and the sensor substrate 30 of the sensor 70); in an embodiment the two different substrates comprise two different materials. As intended herein, a substrate is a self-supporting structure on which additional materials are processed or patterned, for example in layers forming circuits with active or inactive elements, including patterned or unpatterned electrical conductors. A substrate has enough structural rigidity, thickness, and strength that it can be micro-transfer printed from a source wafer to a destination substrate. As used herein, separate, independent, and distinct substrates are separately constructed, optionally at different times and at different locations using at least some different processes and on different wafers. After they are constructed, the separate, independent, and distinct substrates can be transported, manipulated, and stored separately and independently.

Methods of the present invention disclose micro-transfer printing one substrate (e.g., the sensor substrate 30 or sensor 70) onto another separate, independent, and distinct substrate (e.g., the semiconductor substrate 20) and electrically interconnecting them with the electrical conductors 40. The substrates remain separate, independent, and distinct after they are combined into a common structure, since the substrates themselves both remain present in the combined structure. The two different materials can have different attributes, can be processed separately, or can be photolithographic-process incompatible, for example having different materials or process requirements. Thus, the semiconductor substrate 20 can be produced in a first technology comprising a first material 25 (e.g., semiconductor material 25) and the sensor substrate 30 can be produced in a second technology different from the first technology and comprising a second material different from the first material. By first technology is meant the materials, methods, and processes for making the active electronic circuit 22 in the semiconductor substrate 20 and semiconductor material 25. By second technology is meant the materials, methods, and processes for making the sensor circuit 36 in the sensor substrate 30. The first and second technologies differ in that they process different materials (e.g., the semiconductor material 25 and the sensor substrate 30 material) and can create different structures, but can otherwise be similar. For example, both the first and second technologies can employ photolithographic processing technologies. It can be the case that materials useful and most appropriate for constructing sensors 70 are different from those that are most useful and appropriate for processing signals. Hence, by employing different materials or process technologies, the manufacturing process and performance of both elements is improved and by micro-transfer printing the sensor 70 or sensor substrate 30 on the semiconductor substrate 20, performance and integration of the compound sensor device 10 is improved and size reduced.

Electrodes 32 (or electrical conductors 40) can be formed or disposed in or on the sensor substrate 30 and are electrically connected to sensor connection pads 34 and provide electrical signals to and from the sensor circuit 36. Alternatively, the electrodes 32 can be considered part of the sensor circuit 36. The sensor circuit 36 is, forms, or incorporates a transducer.

One or more electrical conductors 40 electrically connect one or more of the circuit connection pads 24 to the sensor circuit 36 through the sensor connection pads 34. The active electronic circuit 22 is thus electrically connected to the sensor circuit 36. The semiconductor substrate 20 can have a process side 26 onto which the sensor substrate 30 is directly or indirectly micro-transfer printed. The sensor substrate 30 can have a sensor substrate area 31 that is smaller than the semiconductor substrate area 21 or the electronic circuit area 23, for example that is less than or equal to 80%, 70%, 60%, 50%, 40%, 30%, 20%, or 10% of the area of the semiconductor substrate 20.

As shown in FIG. 1B, the sensor substrate 30 can be micro-transfer printed directly or indirectly on or adhered directly to the semiconductor substrate 20 or on the active electronic circuit 22 formed on or in the semiconductor substrate 20. Thus, the sensor substrate 30 can be in direct contact with the semiconductor substrate 20 or a layer provided over the semiconductor substrate 20. In an embodiment, the active electronic circuit 22 is a part of the semiconductor substrate 20 or forms layers on the semiconductor substrate 20. The semiconductor substrate 20 can include semiconductor material 25 and non-semiconductor material or layers, for example conductive, patterned conductive layers, dielectric layers, or patterned dielectric layers. As intended herein, micro-transfer printing can include direct micro-transfer printing or indirect micro-transfer printing. To micro-transfer print the sensor 70 directly onto the semiconductor substrate 20 means to micro-transfer print the sensor 70 directly on the semiconductor substrate 20, material making up the semiconductor substrate 20, such as semiconductor material 25, or any layers disposed on the semiconductor material 25 that are a part of the semiconductor substrate 20, regardless of material. Alternatively, to micro-transfer print the sensor 70 indirectly on the semiconductor substrate 20 means to micro-transfer print the sensor 70 on layers or structures disposed on the semiconductor substrate 20 that are not part of the semiconductor substrate 20, such as the optional adhesive layer 50 or, in some embodiments, the active electronic circuit 22. Moreover, as used herein, micro-transfer printed on includes adhered to after a micro-transfer printing operation. Whether directly or indirectly micro-transfer printed, the sensor 70 can include at least a portion of a tether 94 from a source wafer 29 on which the sensor 70 originates. Portions of a tether 94 result from fracturing a tether 94 on a source wafer 29 during the micro-transfer printing process (described with respect to FIG. 7 below). The tethers 94 can be formed from one or more layers of the sensor 70 or other layers disposed on the source wafer 29. In embodiments, the active electronic circuit 22 can be located at least partially between the sensor 70 or the sensor substrate 30 and the semiconductor substrate 20 (as shown). This arrangement can efficiently use the available area of the semiconductor substrate 20, improving the system integration. Alternatively, the active electronic circuit 22 can be located to one or more of the sides of the sensor substrate 30 or sensor 70 (not shown).

To facilitate securing the sensor substrate 30 to the semiconductor substrate 20, an optional layer 50 of adhesive can be provided between the sensor 70 and the semiconductor substrate 20. The adhesive can be curable, for example, responsive to heat or electromagnetic radiation to cure and adhere the sensor 70 to the semiconductor substrate 20. The adhesive can be a polymer or resin, for example SU-8, and can be coated on the semiconductor substrate 20 or the sensor 70 or the sensor substrate 30, or both, or provided as a laminate between the semiconductor substrate 20 and the sensor 70 or sensor substrate 30. In an embodiment, the adhesive layer 50 has an extent or area over the semiconductor substrate 20 that is different from the extent or area of the sensor substrate 30 or sensor 70, a shown. The extent is taken in a plane parallel to the surface of the process side 26 of the semiconductor substrate 20 on which the sensor 70 or sensor substrate 30 is micro-transfer printed. The adhesive can be patterned and materials and techniques for patterning curable adhesives are known.

In embodiments of the present invention, the semiconductor substrate 20 can have two relatively flat and substantially parallel opposing sides and can be any structure having a process side 26 suitable for the deposition, processing, and patterning of active and passive electronic structures useful in forming an active electronic circuit 22 and on which the sensor 70 or sensor substrate 30 can be micro-transfer printed. Such structures can include transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. For example, photolithographic processes for making integrated circuits or processing substrates can be employed with suitable semiconductor substrates 20. The semiconductor substrates 20 can include semiconductor materials 25 such as silicon or compound semiconductor materials composed of two or more elements from different groups of the periodic table such as a III-V or II-VI semiconductor substrate. In an embodiment, the semiconductor substrate 20 is a crystalline semiconductor substrate, such as a crystalline silicon semiconductor in which circuits, such as CMOS (complementary metal-oxide-semiconductor) circuits, can be formed using photolithographic processes. By using crystalline semiconductor substrates 20, better performance is achieved than, for example, might be found in a structure using amorphous or polycrystalline semiconductor materials.

According to embodiments of the present invention, the sensor 70 and sensor substrate 30 are micro-transfer printed onto the semiconductor substrate 20, either directly or indirectly. As intended herein, to be micro-transfer printed upon means that separate substrates are separately produced and then brought into proximity and adhered together using a transfer stamp. The sensor 70 or sensor substrate 30 and the semiconductor substrate 20 can be, for example, unpackaged bare die that are directly adhered together so that the sensor 70 or sensor substrate 30 is in direct or indirect contact with the semiconductor substrate 20 or with an adhesive layer 50 that is in direct contact with the semiconductor substrate 20 and sensor substrate 30. As also intended herein, the sensor 70 or sensor substrate 30 micro-transfer printed on the semiconductor substrate 20 also means that the sensor 70 or sensor substrate 30 can be micro-transfer printed on the active electronic circuit 22 or a layer on the active electronic circuit 22, for example an adhesive layer 50. To be micro-transfer printed on or adhered to the active electronic circuit 22 means that the sensor 70 or sensor substrate 30 is micro-transfer printed on or adhered to any of the elements of the active electronic circuit 22, for example upon a semiconductor layer, a patterned or doped semiconductor layer or structure, a conductor layer or patterned conductor, a dielectric layer, a patterned dielectric layer, a protective layer, or any other element of the active electronic circuit 22.

In contrast, as intended herein a layer formed on a semiconductor substrate 20, for example by evaporation, sputtering, or ion beam exposure, whether patterned or not or annealed or not, is not micro-transfer printed upon or adhered to a semiconductor substrate 20 but rather is fused or welded to the semiconductor layer. Such a structure does not include separate, independent, and distinct substrates, one mounted upon the other and is therefore distinct and different from the micro-transfer printing embodiments of the present invention.

The active electronic circuit 22 is a circuit that includes at least one active component or element, for example a transistor, a diode, an amplifier, an oscillator, or a switch. Passive components such as conductors, patterned conductors, resistors, capacitors, and inductors can also be included in the active electronic circuit 22. Elements of the active electronic circuit 22 are electrically connected to circuit connection pads 24. The circuit connection pads 24 are portions of the active electronic circuit 22 that are also available to make electrical connections with electrical devices external to the active electronic circuit 22, for example such as controllers, power supplies, ground, or signal connections. Similarly, the sensor connection pads 34 can be portions of the electrodes 32 or electrically conductive areas electrically connected to the electrodes 32. The circuit connection pads 24 and sensor connection pads 34 can simply be a part of an electrical conductor 40 or electrode 32 and indistinguishable from it. The circuit connection pads 24 or sensor connection pads 34 can be, for example, rectangular or circular areas of electrically conductive materials such as the conductors listed above, accessible or exposed to external elements such as wires or conductors, including the electrical conductors 40. The circuit connection pads 24 or sensor connection pads 34 can have any shape conducive to the formation of electrical connections.

Figure 6:
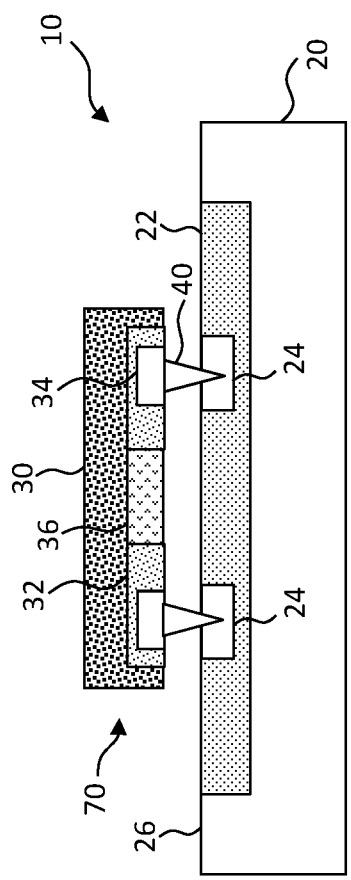
FIG. 6 is a cross section of an embodiment of the present invention having a sensor with electrically connecting protrusions.

Electrical connections to the circuit connection pads 24 can be made using solder and solder methods, photolithographic processes, or by contacting and possibly penetrating the circuit connection pads 24 with electrically conductive protrusions or spikes formed in or on a device with another substrate separate, distinct, and independent from the semiconductor substrate 20 and connected to electrodes 32 in the other substrate (FIG. 6). The other substrate can be the sensor substrate 30 and the electrically conductive protrusions or spikes can be the electrical conductors 40. Electrical connections between an active first circuit on a first substrate (e.g., the active electronic circuit 22 on the semiconductor substrate 20) and electrodes on a second substrate (e.g., the electrodes 32 on the sensor substrate 30) can be made by mechanically pressing conductive protrusions on the second (sensor) substrate 30 in alignment against circuit connection pads 24 on the first (semiconductor) substrate 20, for example with a transfer stamp, to form electrical interconnections without photolithographic processing and are described in U.S. patent application Ser. No. 14/822,864 entitled "Chiplets with Connection Posts" whose contents are incorporated by reference in its entirety. In an embodiment, the sensor connection pads 34 can be the base of the electrically conductive protrusions or spikes.

The sensor substrate 30 can be any substrate in which a sensor circuit 36 can be formed. For example, the sensor substrate 30 can include one or more of any of a semiconductor, a compound semiconductor, a III-V semiconductor, a II-VI semiconductor, GaAs, InSb, a magnetoresistive material, or a quantum well material or structure. The sensor substrate 30 can be crystalline. In an embodiment, the material of the sensor substrate 30 has a greater carrier mobility than the semiconductor material 25. In an embodiment, the semiconductor substrate 20 is a crystalline silicon substrate and the sensor substrate 30 is a crystalline III-V semiconductor substrate. The sensor circuit 36 can be a sensor structure, such as a photodiode, a capacitor, a magnetic sensor, a current sensor, or a Hall-effect device. The sensor substrate 30 can be processed using photolithographic methods to form the electrodes 32, sensor connection pads 34, or sensor circuit 36 and can have two relatively flat and substantially parallel opposing sides. Alternatively, other methods such as micro-embossing and inkjet deposition can be used to form structures on the sensor substrate 30. In an embodiment, the processing materials or methods of the sensor substrate 30 and electrodes 32 are at least partially different from and incompatible with the processing materials and methods of the semiconductor substrate 20 and active electronic circuit 22.

The semiconductor substrate 20 and the sensor substrate 30 can take a variety of forms, shapes, sizes, and materials. In one embodiment, the sensor substrate 30 is thicker than the semiconductor substrate 20. In another embodiment, the sensor substrate 30 is thinner than the semiconductor substrate 20, or the sensor substrate 30 and the semiconductor substrate 20 can have the same thickness. The semiconductor substrate 20 can have a thickness less than 20 microns, less than 10 microns, or less than 5 microns. The sensor substrate 30 can have a thickness less than 10 microns, less than 5 microns, or less than 1 micron. Alternatively, the sensor substrate 30 can have a thickness greater than 0.5 microns, greater than 1 micron, greater than 2 microns, or greater than 5 microns. Such a variety of sizes can enable highly integrated and small structures useful in a corresponding variety of electronic systems.

The sensor circuit 36 can form a transducer. A transducer converts energy in one form to energy in another form. For example, the sensor circuit 36 can be an actuator that can convert electrical energy (an electrical current in the electrodes 32) into an electrical or magnetic field. Alternatively, the sensor circuit 36 can convert an electrical or magnetic field into electrical energy (an electrical current in the electrodes 32).

Figure 2:
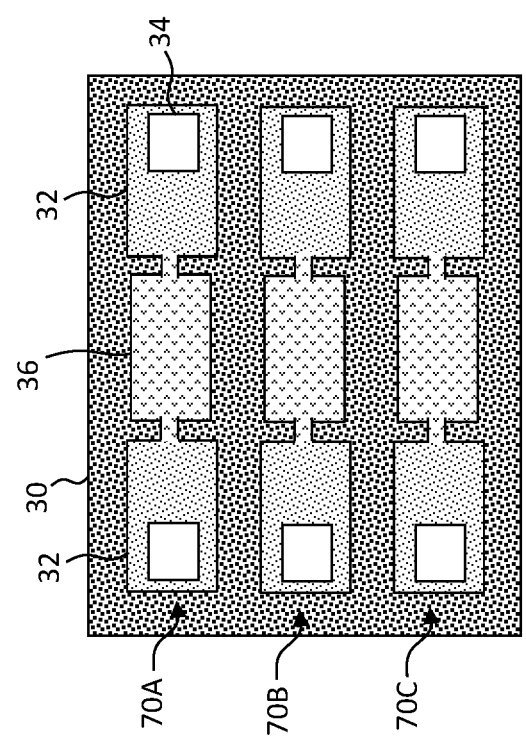
FIG. 2 is a schematic plan view of a sensor substrate and a plurality of sensors with a common sensor substrate according to another embodiment of the present invention.

Referring to FIG. 2, in an embodiment of the present invention, the electrodes 32 form a plurality of electrode pairs. Each electrode pair connects a separate sensor circuit 36 formed on or in the sensor substrate 30 so that each sensor circuit 36 has a common sensor substrate 30. The plurality of sensor circuits 36 for a corresponding plurality of sensors 70A, 70B, 70C on a common sensor substrate 30. Each of the electrodes 32 is connected to a sensor circuit 36 and a sensor connection pad 34 and, with the electrical conductors 40, to a circuit connection pad 24 and thus to the active electronic circuit 22 (FIG. 1A). Thus, multiple sensors 70A, 70B, 70C can be provided in a common sensor substrate 30 and electrically connected to a common active electronic circuit 22 to provide multiple sensing or actuating operations, or both. Multiple sensors 70 electrically connected to a common active electronic circuit 22 can improve the integration density of the compound sensor device 10 of the present invention. The sensors 70 can be the same kind of sensor and the combined output of the sensors 70 can reduce the noise in the sensed signals. Alternatively, the sensors 70 can be different kinds of sensors or sense different environmental attributes.

Figure 3:
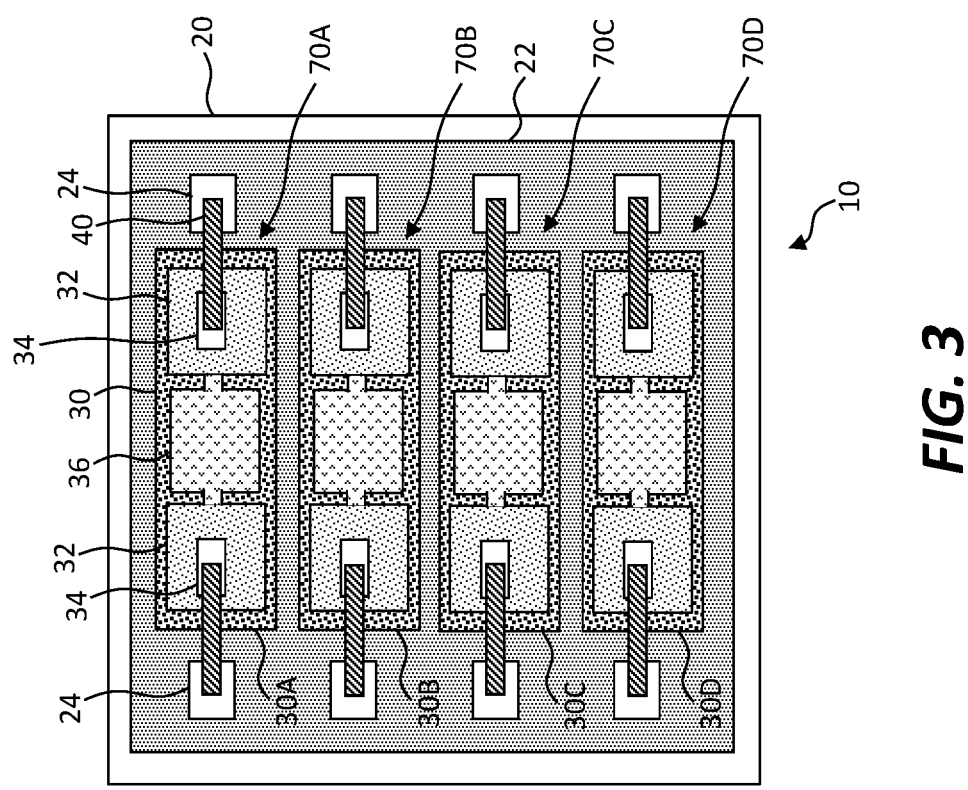
FIG. 3 is a schematic plan view of a plurality of sensors and a corresponding plurality of distinct, separate and independent sensor substrates on a semiconductor substrate according to yet another embodiment of the present invention.

In another embodiment of the present invention illustrated in FIG. 3, a plurality of sensors 70A, 70B, 70C, 70D each having a separate, distinct, and independent sensor substrate 30 (sensor substrate 30A, sensor substrate 30B, sensor substrate 30C, and sensor substrate 30D), electrodes 32, and a sensor circuit 36, is micro-transfer printed onto the semiconductor substrate 20. The sensor substrates 30 can be made in different materials or with different processes. Whether or not they employ the same or different substrate materials and processes, the plurality of sensor substrates 30 can have reduced cross talk and improved performance compared to the embodiment of FIG. 2. The electrodes 32 and sensor circuits 36 of each of the sensor substrates 30A, 30B, 30C, 30D are connected to corresponding sensor connection pads 34 and circuit connection pads 24 with one or more of the electrical conductors 40.

Thus, in an embodiment of the present invention, sensors 70 can be constructed on a common semiconductor substrate 20 and electrically connected to a common active electronic circuit 22. Such an integrated compound sensor device 10 can be very small, for example having a length or breadth dimension of less than or equal to 1 mm, less than or equal to 800 µm, less than or equal to 600 µm, less than or equal to 400 µm, less than or equal to 200 µm, less than or equal to 100 µm, less than or equal to 50 µm, or less than or equal to 20 µm. The height of the compound sensor device 10 can be less than or equal to 100 µm, less than or equal to 50 µm, less than or equal to 20 µm, less than or equal to 10 µm, less than or equal to 5 µm, or less than or equal to 2 µm. The semiconductor substrate 20 likewise can have a length or breadth dimension of less than or equal to 1 mm, less than or equal to 800 µm, less than or equal to 600 µm, less than or equal to 400 µm, less than or equal to 200 µm, less than or equal to 100 µm, less than or equal to 50 µm, or less than or equal to 20 µm. The compound sensor device 10 can be a surface-mount device.

In an embodiment of the present invention the semiconductor substrate 20 or the sensor substrate 30, or both, are chiplets. Chiplets can be small integrated circuits or processed substrates, for example bare die, that are integrated into a compound device structure using micro-transfer printing. In an embodiment, the sensor 70 or sensor substrate 30 is not an integrated circuit with active circuit components but rather a small substrate processed using photolithographic methods to provide passive elements such as electrodes 32 and sensor connection pads 34 thereon. Alternatively, the sensor substrate 30 is an integrated circuit with active circuit components. The compound sensor device 10 can be subsequently packaged after integrating the semiconductor substrate 20 with the sensor 70 using micro-transfer printing. In various embodiments, the semiconductor substrate 20, sensor 70, or the sensor substrate 30 has a width from 2 to 5 µm, 5 to 10 µm, 10 to 20 µm, or 20 to 50 µm, the semiconductor substrate 20, sensor 70, or the sensor substrate 30 has a length from 2 to 5 µm, 5 to 10 µm, 10 to 20 µm, or 20 to 50 µm, or the semiconductor substrate 20 sensor 70, or the sensor substrate 30 has a thickness from 50 µm to 20 µm, 20 µm to 10 µm, 10 µm to 5 µm, 5 µm to 1 µm, or 1 µm 0.1 µm, or a thickness from. Such small substrate elements provide a high degree of integration and consequently reduced manufacturing costs and improved performance.

Figure 4:
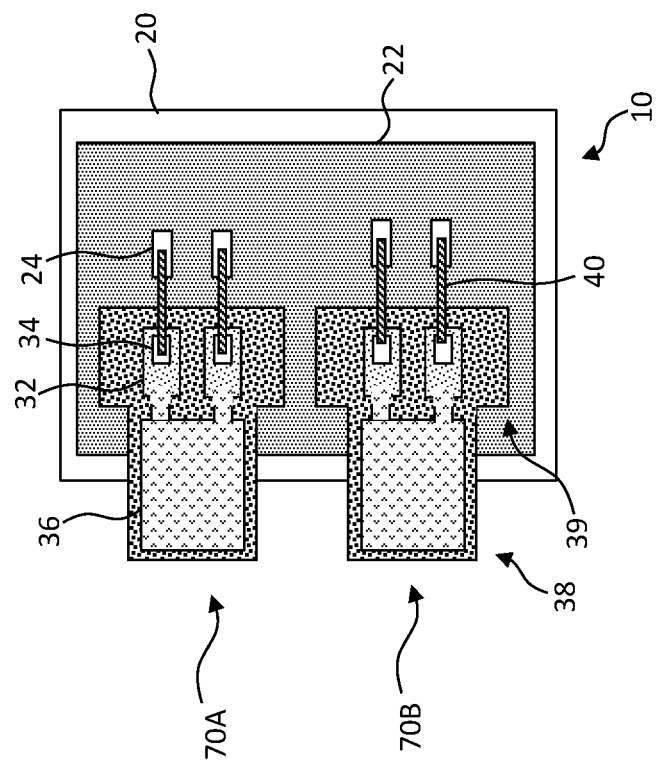
FIG. 4 is a schematic plan view of sensor substrates micro-transfer printed on a semiconductor substrate according to yet another embodiment of the present invention.

Referring back to FIG. 1B, in one embodiment of the present invention, the sensor 70 extends orthogonally from the semiconductor substrate process surface 26. Since the sensor substrate 30 can be significantly smaller than the semiconductor substrate 20, this can enable the sensor 70 to more closely approach a sensed element, such as a mechanical element. In contrast, referring to FIG. 4, the sensors 70A, 70B can extend from the semiconductor substrate 20 in a direction parallel to the process surface 26. Again, this arrangement can enable the sensor 70 to more closely approach a sensed element, such as a mechanical element, in a different orientation. Although the sensor circuit 36 is illustrated as disposed on a sensor 70 surface parallel to the process side 26 of the semiconductor substrate 20, in other embodiments, the sensor circuit 36 is located on other sides of the sensor substrate 30, for example a side that has a surface disposed orthogonally to the process side 26 (not shown). In another embodiment, the sensor 70 has a first portion 38 smaller than a second portion 39 and the first portion 38 extends from the semiconductor substrate 20. In another embodiment, the sensor 70 has a plurality of first portions 38 smaller than a second portion 39 and the first portions 38 extend from the semiconductor substrate 20.

Figure 5:
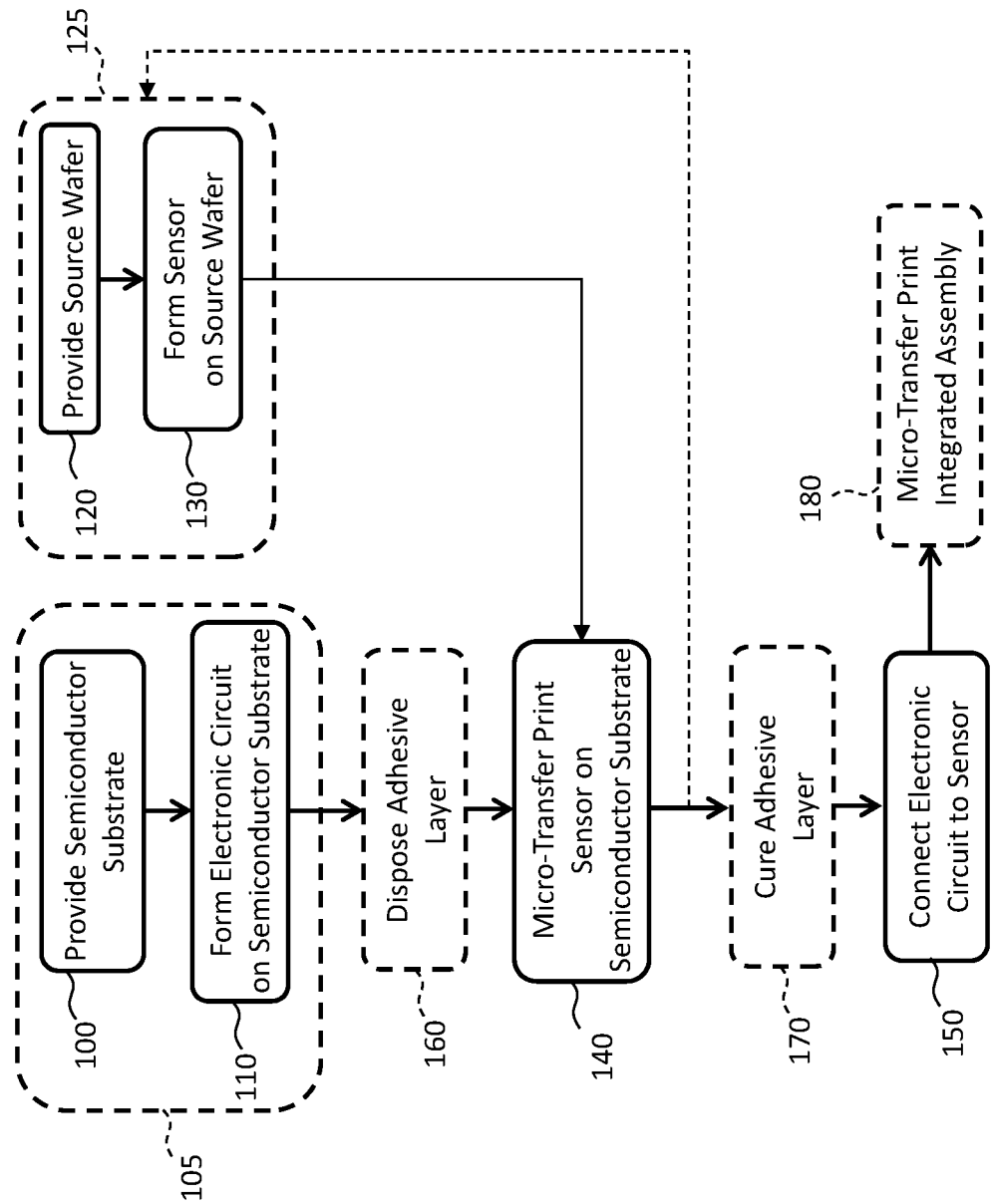
FIG. 5 is a flow diagram illustrating a method of the present invention.

Referring to FIG. 5, a method of making a compound sensor device 10 includes providing a semiconductor substrate 20 with an active electronic circuit 22 formed in or on the semiconductor substrate 20 in step 105. Alternatively, the semiconductor substrate 20 can first be provided in step 100 and then the active electronic circuit 22 formed in or on the semiconductor substrate 20 in step 110. The active electronic circuit 22 includes one or more circuit connection pads 24 connected to the active electronic circuit 22 for providing signals to the active electronic circuit 22 or receiving signals from the active electronic circuit 22. A sensor substrate 30 separate, distinct, and independent from the semiconductor substrate 20 is provided in step 120 and electrodes 32 and sensor circuit 36 formed in or on the sensor substrate 30 in step 130 to form a sensor 70. In another embodiment, the sensor substrate 30 and electrodes 32 are provided in a single step 125. In one embodiment of the present invention, step 130 provides a plurality of sensors 70 on a single sensor substrate 30 (e.g., corresponding to the structure of FIG. 2), for example by providing four or more electrodes 32 on the sensor substrate 30 connected to two or more sensor circuits 36 forming two or more sensors 70. Alternatively, or in addition, step 125 is repeated to provide a plurality of sensors 70 on separate sensor substrates 30 (e.g., corresponding to the structure of FIG. 3).

The sensor substrate 30 is mounted on the semiconductor substrate 20 in step 140 by micro-transfer printing so that each sensor substrate 30 includes a fractured or separated tether 94. In an alternative embodiment, step 140 is repeated to provide a plurality of sensor substrates 30 micro-transfer printed on the semiconductor substrate 20 (e.g., corresponding to the structure of FIG. 4). One or more electrodes 32 and sensor circuits 36 are connected to the active electronic circuit 22 through the sensor connection pads 34, electrical conductors 40, and circuit connection pads 24 for providing an electrical signal to the sensor circuit 36 and for receiving an electrical signal from the sensor circuit 36 in step 150 to construct a compound sensor device 10 of the present invention.

In a further embodiment of the present invention, an optional layer 50 of adhesive is disposed between the sensor substrate 30 and the semiconductor substrate 20 in step 160, for example on the sensor substrate 30, on the semiconductor substrate 20, or with a laminate located between the sensor substrate 30 and the semiconductor substrate 20, before the sensor 70 or sensor substrate 30 is micro-transfer printed on the semiconductor substrate 20. The adhesive can be a curable adhesive and in optional step 170 the adhesive layer 50 is cured to adhere the sensor 70 or sensor substrate 30 to the semiconductor substrate 20 after the sensor 70 or sensor substrate 30 is disposed on the semiconductor substrate 20 by micro-transfer printing. The integrated assembly can be a surface-mount device. In optional step 180, the integrated compound sensor device 10 is itself micro-transfer printed to a system substrate (for example, a printed circuit board, glass, or polymer substrate) as part of a compound micro-assembly structure and process. Alternatively, other methods such as pick-and-place can be used, or surface-mount techniques can be used to dispose the integrated compound sensor device 10 to a desired location, for example as part of a larger electromechanical system or substrate.

In a further embodiment of the present invention, electrical conductors 40 are electrically conductive protrusions or spikes extending from the sensor substrate 30 and the step 140 of micro-transfer printing the sensor substrate 30 onto the semiconductor substrate 20 includes pressing the electrically conductive protrusions or spikes against or into the circuit connection pads 24 to form an electrical connection between the electrodes 32 and the active electrical circuit 22, as illustrated in FIG. 6.

Figure 7:
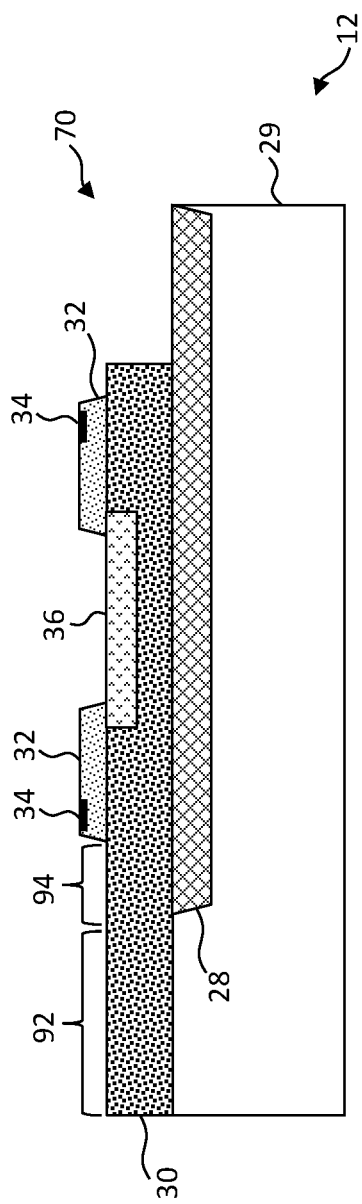
FIG. 7 is a cross section of a wafer having a sensor formed over a patterned sacrificial layer according to an embodiment of the present invention.

Referring to FIG. 7, in an embodiment of the present invention, a sensor wafer 12 includes a source wafer 29 of substrate material having a patterned sacrificial layer 28 forming sacrificial portions 28 on, over, or in the substrate material, a surface of the substrate material, the source wafer 29, or a surface of the source wafer 29. The sacrificial portions 28 define separate anchors 92 between the sacrificial portions 28. A sensor 70 is formed entirely over each sacrificial portion 28. The sensor 70 includes at least (i) a sensor substrate 30 of material and (ii) two or more electrodes 32 and a sensor circuit 36 in or on the material. The portion of each sensor 70 in contact with the sacrificial portion 28 is chemically and selectively etch-resistant so that the contact portion has a chemical selectivity different from the patterned sacrificial layer 28. The contact portion can be a portion of the sensor substrate 30. Because the contact portion has a chemical selectivity different from the patterned sacrificial layer 28, the sacrificial portions 28 can be etched without undue damage to whatever portion of the sensor 70 is in contact with the sacrificial portions 28, for example any or all of the sensor substrate 30. The sacrificial layer can include an oxide such as silicon dioxide or a nitride such as niobium nitride or silicon nitride. In particular, niobium nitride can be used with a gallium nitride (GaN) or silicon carbide (SiC) substrate and silicon dioxide with a silicon substrate. By etching the patterned sacrificial layer 28 in step 280, a tether 94 is formed physically connecting the anchor 92 and the sensor 70. The sacrificial portions 28 then form a gap between the sensor 70 and the source wafer 29 so that the sensor 70 can be micro-transfer printed in step 140 onto the semiconductor substrate 20 or an adhesive layer 50 disposed on the semiconductor substrate 20 as described above. The adhesive layer 50 is then cured (step 170), so that the electrical conductors 40 can be formed (step 150) electrically connecting the active electronic circuit 22 to the sensor circuit 36 to form the compound sensor device 10 of the present invention.

A plurality of the sensors 70 can be made in a sensor wafer 12 comprising the material of the sensor substrate 30. As shown in FIG. 7, sacrificial layers 28 or sacrificial portions 28, tethers 94, and anchors 92 can be formed between the electrodes 32 and the sensor wafer 12 to form individual sensor substrates 30, each sensor substrate 30 having one or more electrodes 32 and a sensor circuit 36, and render the sensors 70 and sensor substrates 30 micro-transfer printable. Similarly, an array of the active electronic circuits 22 can be made in a crystalline semiconductor wafer, for example, a silicon wafer such as silicon (1 0 0) or silicon (1 1 1). The sensor substrates 30 can be micro-transfer printed onto the semiconductor substrates 20 (the semiconductor wafer) and the electrodes 32, sensor circuit 36, and active electronic circuit 22 electrically connected with the electrical conductors 40. The integrated micro-transfer printed assembly can be used in a system as it is or the semiconductor wafer can be diced and optionally packaged, for example to form surface-mount devices, and disposed as desired in a system. Alternatively, sacrificial layers or sacrificial portions 28, tethers 94, and anchors 92 can be formed between the active electronic circuit 22 and the semiconductor wafer to form individual semiconductor substrates 20 and render the active electronic circuit 22 and electrode 32 assemblies micro-transfer printable. The heterogeneous compound sensor devices 10 of the present invention can then be micro-transfer printed as desired in a system.

Figure 8:
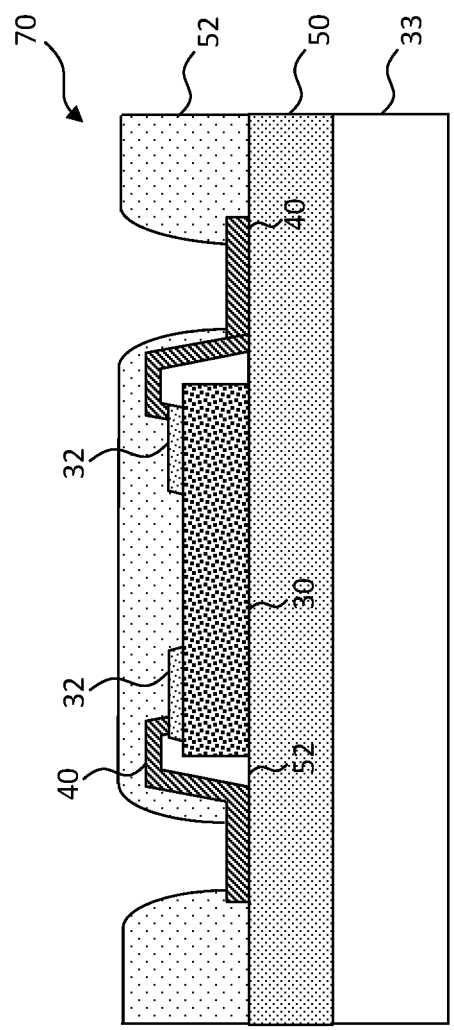
FIG. 8 is a cross section of a surface-mount embodiment of the present invention.

In another embodiment of the present invention and in reference to FIG. 8, the sensor 70 is micro-transfer printed onto a passive substrate 33, the electrical conductors 40 formed and a dielectric layer 52 patterned to expose contact pads to provide a surface-mount device 78 that can be surface mounted and electrically connected in a circuit.

Various elements and layers can be formed or processed at different times or in different orders than as described. The compound sensor device 10 can be a surface-mount device and be disposed in a circuit on another substrate such as in an electromechanical circuit on a printed circuit board. Alternatively, the semiconductor substrate 20 can itself have a patterned sacrificial layer 28 formed under the active electronic circuit 22 that can be etched to provide a micro-transfer printable compound sensor device 10, as described below with respect to FIG. 9.

Figure 9:
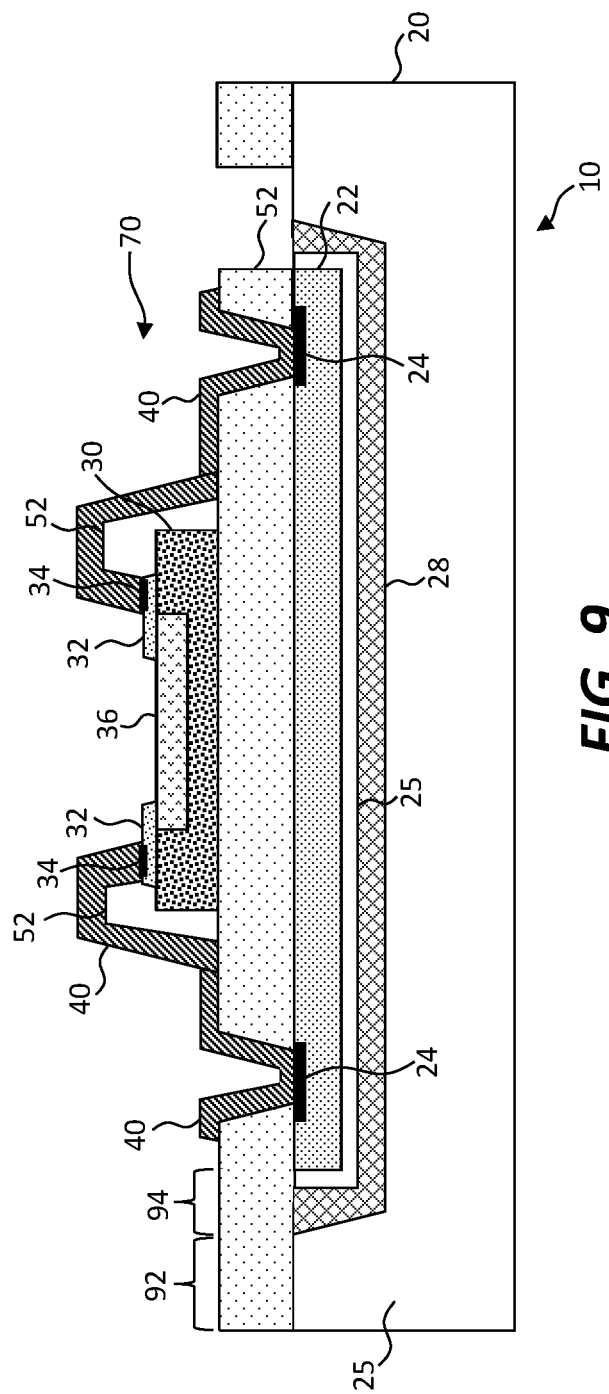
FIG. 9 is a cross section illustrating a compound sensor wafer and micro-transfer printable device of the present invention.

Referring to FIG. 9, in another aspect of the present invention, a patterned sacrificial layer 28 is formed in the semiconductor substrate 20 and the active electronic circuit 22 formed entirely over the patterned sacrificial portions 28. The sensor 70 is then micro-transfer printed onto the semiconductor substrate 20, layers on the semiconductor substrate 20, or the active electronic circuit 22. A patterned dielectric layer 52 is formed to protect and insulate the sensor substrate 30 (as shown) or the sensor circuit 36 (not shown) and expose the sensor connection pads 34. The electrical conductors 40 are formed to connect the sensor connection pads 34 to the circuit connection pads 24. The patterned sacrificial portions 28 can then be etched to provide the compound sensor device 10 itself as a micro-transfer printable device, for example using or applied to compound micro-assembly methods.

In operation, the compound sensor device 10 receives electrical signals from a controller (not shown) through circuit connection pads 24 to activate the active electronic circuit 22 on the semiconductor substrate 20. The active electronic circuit 22 can further process the signals or communicate the signals, or both, to the electrodes 32 or sensor circuit 36 on the sensor substrate 30 through the circuit connection pads 24, the electrical conductors 40, and the sensor connection pads 34. The electrodes 32 communicate or the sensor circuit 36 processes the communicated signals and provides the sensor signal through the sensor connection pads 34, the electrical conductors 40, and the circuit connection pads 24 to the active electronic circuit 22. The active electronic circuit 22 can further process the signals and enable actions or communicate the signals to the controller.

U.S. patent application Ser. No. 14/743,981, filed Jun. 18, 2015, entitled Micro Assembled LED Displays and Lighting Elements, incorporated herein by reference describes micro-transfer printing structures and processes useful with the present invention. For a discussion of micro-transfer printing techniques see, U.S. Pat. Nos. 8,722,458, 7,622,367 and 8,506,867, each of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer or sacrificial portion 28 is considered "on" a substrate when a layer of sacrificial material or sacrificial portion 28 is on top of the substrate, when a portion of the substrate itself is the sacrificial layer 28, or when the sacrificial layer or sacrificial portion 28 comprises material on top of the substrate and a portion of the substrate itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
10 compound sensor device
12 sensor wafer
20 semiconductor substrate
21 semiconductor substrate area
22 active electronic circuit
23 electronic circuit area
24 circuit connection pad
25 semiconductor material
26 process side/process surface
28 sacrificial layer/sacrificial portion
29 source wafer
30 sensor substrate
30A sensor substrate
30B sensor substrate
30C sensor substrate
30D sensor substrate
31 sensor substrate area
32 electrode
33 passive substrate
34 sensor connection pad
26 sensor circuit
38 first portion
39 second portion
40 electrical conductor
50 adhesive layer
52 dielectric layer
70 sensor
70A sensor
70B sensor
70C sensor
70D sensor 78 surface-mount device
92 anchor
94 tether
100 provide semiconductor substrate step
105 provide semiconductor substrate with electronic circuit step
110 form electronic circuit on semiconductor substrate step
120 provide source wafer step
125 provide sensor on source wafer step
130 form sensor on source wafer step
140 micro-transfer print sensor on semiconductor substrate step
150 connect electronic circuit to sensor circuit step
160 optional dispose adhesive layer step
170 optional cure adhesive layer step
180 optional micro-transfer print integrated assembly step

What is claimed is:

1. A compound sensor device, comprising:
a semiconductor substrate;
an active electronic circuit formed in or on the semiconductor substrate;
one or more circuit connection pads connected to the active electronic circuit for providing input signals to the active electronic circuit or receiving output signals from the active electronic circuit;
a sensor comprising:
a sensor substrate separate, distinct, and independent from the semiconductor substrate, wherein the sensor is disposed onto the semiconductor substrate,
a sensor circuit formed in or on the sensor substrate, the sensor circuit comprising an environmental sensor or an actuator, and
one or more sensor connection pads connected to the sensor circuit for providing the input signals to the sensor circuit or receiving the output signals from the sensor circuit; and
one or more electrical conductors electrically connecting one or more of the one or more circuit connection pads to one or more of the one or more sensor connection pads, wherein the semiconductor substrate comprises a first material and the sensor substrate comprises a second material different from the first material,
wherein the sensor is disposed directly over at least a portion of the active electronic circuit and located so that the active electronic circuit is at least partially directly between the sensor and the semiconductor substrate in a first direction orthogonal to a surface of the semiconductor substrate, and
wherein the sensor comprises a fractured tether.

2. The compound sensor device of claim 1, wherein the sensor substrate comprises a semiconductor.

3. The compound sensor device of claim 2, wherein the first material comprises silicon and the second material comprises a compound semiconductor material.

4. The compound sensor device of claim 2, wherein the semiconductor substrate has a process side, the active electronic circuit is formed on or in the process side, and the sensor substrate is disposed onto the process side.

5. The compound sensor device of claim 1, wherein the first material is a crystalline semiconductor.

6. The compound sensor device of claim 1, wherein the sensor substrate has an entire substrate area that is smaller than an entire area of the semiconductor substrate.

7. The compound sensor device of claim 6, wherein the entire substrate area of the sensor substrate is less than or equal to 50% of the entire area of the semiconductor substrate.

8. The compound sensor device of claim 1, wherein the sensor extends from the semiconductor substrate in a second direction parallel to the surface of the semiconductor substrate.

9. The compound sensor device of claim 1, wherein the sensor has a first portion smaller than a second portion and the first portion extends from the semiconductor substrate.

10. The compound sensor device of claim 1, wherein the sensor has a plurality of first portions smaller than one or more second portions and the plurality of first portions extend from the semiconductor substrate.

11. The compound sensor device of claim 1, wherein the sensor substrate has a thickness that is less than a thickness of the semiconductor substrate.

12. The compound sensor device of claim 1, wherein the compound sensor device is a surface-mount device.

13. The compound sensor device of claim 1, wherein the sensor substrate has a length or a breadth dimension from 200 µm to 100 µm, 100 µm to 50 µm, 50 µm to 20 µm, 20 µm to 10 µm, or 10 µm to 1 µm.

14. The compound sensor device of claim 1, wherein the sensor is at least one of:
micro-transfer printed directly on the semiconductor substrate,
and
micro-transfer printed directly on the active electronic circuit.

15. The compound sensor device of claim 1, wherein the sensor circuit comprises (i) the environmental sensor and the actuator, (ii) a plurality of environmental sensors and the plurality of environmental sensors comprises the environmental sensor, (iii) a plurality of actuators and the plurality of actuators comprises the actuator, or (iv) a plurality of environmental sensors and a plurality of actuators and the plurality of environmental sensors comprises the environmental sensor and the plurality of actuators comprises the actuator.

16. The compound sensor device of claim 1, wherein the sensor is a first sensor and the compound sensor device further comprises:
one or more second sensors disposed on the semiconductor substrate and different from the first sensor, wherein each second sensor of the one or more second sensors comprises:
a respective fractured tether,
a respective sensor substrate of the plurality of sensors separate, distinct, and independent from the semiconductor substrate and separate, distinct, and independent from any other sensor substrate,
a respective sensor circuit formed in or on the respective sensor substrate, the respective sensor circuit comprising a respective environmental sensor or a respective actuator, and
one or more respective sensor connection pads connected to the respective sensor circuit for providing the input signals to the respective sensor circuit or receiving the output signals from the respective sensor circuit,
wherein, for each of the one or more second sensors, one or more of the one or more electrical conductors electrically connects one or more of the one or more circuit connection pads to one or more of the one or more respective sensor connection pads.

17. The compound sensor device of claim 16, wherein the respective sensor substrate of each of the one or more second sensors comprises a material different than that of the sensor substrate of the first sensor.

18. The compound sensor device of claim 1, wherein the one or more electrical conductors are one or more electrically conductive protrusions or spikes extending from the sensor, a portion or layer of the sensor, or the sensor substrate.

19. The compound sensor device of claim 1, wherein the second material is a crystalline semiconductor.

20. The compound sensor device of claim 1, wherein the fractured tether is a single fractured tether and the sensor comprises only one fractured tether disposed at an edge of the sensor.

21. A method of making a compound sensor device, comprising:
providing a semiconductor substrate with an active electronic circuit formed in or on the semiconductor substrate and one or more circuit connection pads for providing input signals to the active electronic circuit or receiving output signals from the active electronic circuit;
providing a sensor, the sensor comprising:
  a sensor substrate separate, distinct, and independent from the semiconductor substrate,
  a sensor circuit formed in or on the sensor substrate, the sensor circuit comprising an environmental sensor or an actuator, and
  one or more sensor connection pads connected to the sensor circuit for providing the input signals to the sensor circuit or receiving the output signals from the sensor circuit, wherein the sensor comprises a fractured tether;
micro-transfer printing the sensor substrate onto the semiconductor substrate, wherein the sensor is disposed directly over at least a portion of the active electronic circuit and located so that the active electronic circuit is at least partially between the sensor and the semiconductor substrate in a direction orthogonal to a surface of the semiconductor substrate; and
electrically connecting one or more of the one or more circuit connection pads to one or more of the one or more sensor connection pads, wherein the semiconductor substrate comprises a first material and the sensor substrate comprises a second material different from the first material.

22. The method of claim 21, further comprising:
providing one or more electrical conductors, wherein the one or more electrical conductors are one or more electrically conductive protrusions or spikes extending from the sensor or the sensor substrate; and
pressing the one or more electrically conductive protrusions or spikes against, into, or through the one or more circuit connection pads to form an electrical connection between the sensor and the active electronic circuit.

* * * * *